(12) United States Patent
Theel

(10) Patent No.: US 7,113,422 B2
(45) Date of Patent: Sep. 26, 2006

(54) METHOD FOR OPTIMIZING MRAM CIRCUIT PERFORMANCE (75) Inventor: Wayne Theel, Plymouth, MN (US)

(73) Assignee: Union Semiconductor Technology Corporation, Plymouth, MN (US)

( * ) Notice: Subject to any disclaimer, the term of this patent is extended or adjusted under 35 U.S.C. 154(b) by 155 days.

(21) Appl. No.: 10/724,984

(22) Filed: Nov. 30, 2003

(65) Prior Publication Data
US 2005/0117425 A1    Jun. 2, 2005

(51) Int. Cl.
G11C 11/00    (2006.01)

(52) U.S. Cl. .................... 365/158; 365/97; 365/209

(58) Field of Classification Search ............ 365/158, 365/97, 209
See application file for complete search history.

(56) References Cited

U.S. PATENT DOCUMENTS

| | | | |
|---|---|---|---|
| 5,946,227 A | 8/1999 | Naji | |
| 6,246,630 B1 | 6/2001 | Hosokawa et al. | |
| 6,341,084 B1 | 1/2002 | Numata et al. | |
| 6,385,111 B1 | 5/2002 | Tran et al. | |
| 6,407,946 B1 | 6/2002 | Maruyama et al. | |
| 6,590,804 B1 | 7/2003 | Perner | |
| 6,674,679 B1 | 1/2004 | Perner et al. | |
| 6,683,815 B1 | 1/2004 | Chen et al. | |
| 6,700,814 B1 | 3/2004 | Nahas et al. | |
| 6,791,874 B1 | 9/2004 | Tran et al. | |
| 6,795,340 B1 | 9/2004 | Sakimura et al. | |
| 6,803,615 B1 | 10/2004 | Sin et al. | |
| 6,804,144 B1 | 10/2004 | Iwata | |
| 6,834,017 B1 * | 12/2004 | Perner et al. ............ | 365/209 |
| 6,873,543 B1 | 3/2005 | Smith et al. | |
| 2004/0085122 A1 | 5/2004 | Perner et al. | |
| 2004/0228170 A1 | 11/2004 | Brennan et al. | |
| 2005/0083748 A1* | 4/2005 | Lemus et al. ............ | 365/210 |

* cited by examiner

Primary Examiner—Huan Hoang
(74) Attorney, Agent, or Firm—Jones Day (57) ABSTRACT A method to adjust an operating parameter of a magnetoresistive random access memory having a tunable circuit, such as a bias control circuit, provides for measuring the operating parameter, such as a word current or sense current, of the magnetoresistive random access memory to obtain a measured operating parameter result and tuning the tunable circuit, such as with trimmable resistors, based on the measured operating parameter result. A method is also provided to adjust an operating parameter of a wafer of magnetic random access memories each having a tunable circuit by measuring the operating parameter one or more of the magnetic random access memories to obtain a measured operating parameter result and tuning some or all of the tunable circuits based on the measured operating parameter result.

11 Claims, 8 Drawing Sheets

METHOD FOR OPTIMIZING MRAM CIRCUIT PERFORMANCE

This application is related to co-pending patent application Ser. Nos. 10/724,983, 10/724,985, 10/724,986 and 10/724,987, each of which was filed on Nov. 30, 2003.

FIELD OF THE INVENTION

The present invention relates to a magnetoresistive random access memory and more particularly to a magnetoresistive random access memory having optimized circuit performance.

BACKGROUND OF THE INVENTION

Typical Magnetoresistive random access memory (MRAM) structures have a nonmagnetic layer sandwiched between two ferromagnetic films. The two ferromagnetic films are also known as magnetic thin films. The MRAM employs the magneto resistive properties of this structure to store data. In each storage element, an MRAM employs two lines, commonly termed a word line and a sense string, in order to detect the magnetization direction of these magnetic thin films. Each string comprises a magnetic thin film that serves as a memory element, and the word line generally addresses multiple sense strings. Magnetic thin films that have a parallel moment have a low resistance and are typically assigned the '1' state. Magnetic thin films having an anti-parallel moment have a high resistance and are typically assigned the '0' state, but may also be assigned to the '1' state.

During a read operation, a word current passes through the word line causing the magnetic layers in the sense string to rotate, thereby changing the resistance in the sense string. A sense current passes through the sense string. A sense line receives the signal from the sense string. A differential amplifier compares the signal from the sense line to a reference line to determine whether a one resistance or a zero resistance is stored in the MRAM. A differential amplifier notes the change in voltage across the sense line to determine resistive state of a storage element.

MRAM operation requiring only small variations from the desired operation conditions is preferred. Changes, such as normal variances, induced during the fabrication process may require different operational biases and associated references than the default circuitry provides.

Others have tried having one setting or a sampling of chips with different settings and then testing for all good or bad chips. Methods of changing analog operating points, such as laser trimming, are well known but have not been utilized for MRAM manufacture.

There is a need to compensate for these differences in operating conditions.

There is a further need for a method to change the default setting level of the bias circuitry to match the required operation point.

There is a further need to optimize circuit performance of sensitive circuits.

There is a further need to provide a way of testing and setting analog operating points after chip fabrication of the MRAM.

SUMMARY

The present invention solves these needs and other problems in the field of chip optimizing methods by providing, in most preferred aspects, a method to adjust an operating parameter of a magnetoresistive random access memory having a tunable circuit that can be tested and adjusted comprising: measuring the operating parameter of the magnetoresistive random access memory to obtain a measured operating parameter result; and tuning the tunable circuit based on the measured operating parameter result.

In other aspects of the present invention, the method provides that the tunable circuit is a bias control circuit.

In other aspects of the present invention, the method provides that the operating parameter is a word current.

In other aspects of the present invention, the method provides that the operating parameter is a sense current.

In other aspects of the present invention, the method provides a method to adjust an operating parameter of a plurality of magnetic random access memories each having a tunable circuit comprising: measuring the operating parameter of at least one of the magnetic random access memories to obtain a measured operating parameter result; and tuning at least one of the plurality of the tunable circuits based on the measured operating parameter result.

In other aspects of the present invention, the method provides that the tunable circuit is a bias control circuit.

In other aspects of the present invention, the method provides that the plurality of magnetic random access memories are constructed on a single wafer.

In other aspects of the present invention, the method provides that the operating parameter is a word current.

In other aspects of the present invention, the method provides that the operating parameter is a sense current.

In other aspects of the present invention, a bias tuning circuit for a MRAM comprising, in combination: a bias generator having a bias output; a plurality of switches having a word reference input and a mirror transistor output; a plurality of mirror transistors connected to one of the mirror transistor outputs; a transistor connected in a mirror configuration with the plurality of mirror transistors having a tuned reference output; a selector to select one of the mirror transistor to activate the transistor to set the voltage to the plurality of mirror transistors.

In other aspects of the present invention, each one of the plurality of mirror transistors have a different gain.

In other aspects of the present invention, the bias tuning circuit further comprises a pad and an indicator transistor in a mirror configuration with the transistor connected to the pad to provide an indicator.

In other aspects of the present invention, the pad is an external pad.

In other aspects of the present invention, the indicator transistor has a gain that is a multiple of the transistor.

In other aspects of the present invention, the plurality of mirror transistors are n-channel transistors.

In other aspects of the present invention, the plurality of switches are transistors.

In other aspects of the present invention, the transistor is an N-channel transistor.

In other aspects of the present invention, the bias generator is a temperature and voltage compensated bias generator.

In other aspects of the present invention, the selector selects one of the plurality of mirror transistors to compensate for a tested parameter.

In other aspects of the present invention, the tested parameter is a manufacturing variance.

The present invention will become clearer in light of the following detailed description of illustrative embodiments of this invention described in connection with the drawings.

DESCRIPTION OF THE DRAWINGS

The illustrative embodiments may best be described by reference to the accompanying drawings where.

All figures are drawn for ease of explanation of the basic teachings of the present invention only; the extensions of the figures with respect to number, position, relationship, and dimensions of the parts to form the preferred embodiment will be explained or will be within the skill of the art after the following description has been read and understood. Further, the exact dimensions and dimensional proportions to conform to specific force, weight, strength, and similar requirements will likewise be within the skill of the art after the following description has been read and understood.

Where used in the various figures of the drawings, the same numerals designate the same or similar parts. Furthermore, when the terms "side," "end," "bottom," "first," "second," "laterally," "longitudinally," "row," "column," and similar terms are used herein, it should be understood that these terms have reference only to the structure shown in the drawings as it would appear to a person viewing the drawings and are utilized only to facilitate describing the illustrative embodiment.

DESCRIPTION OF THE PREFERRED EMBODIMENTS

Figure 1:
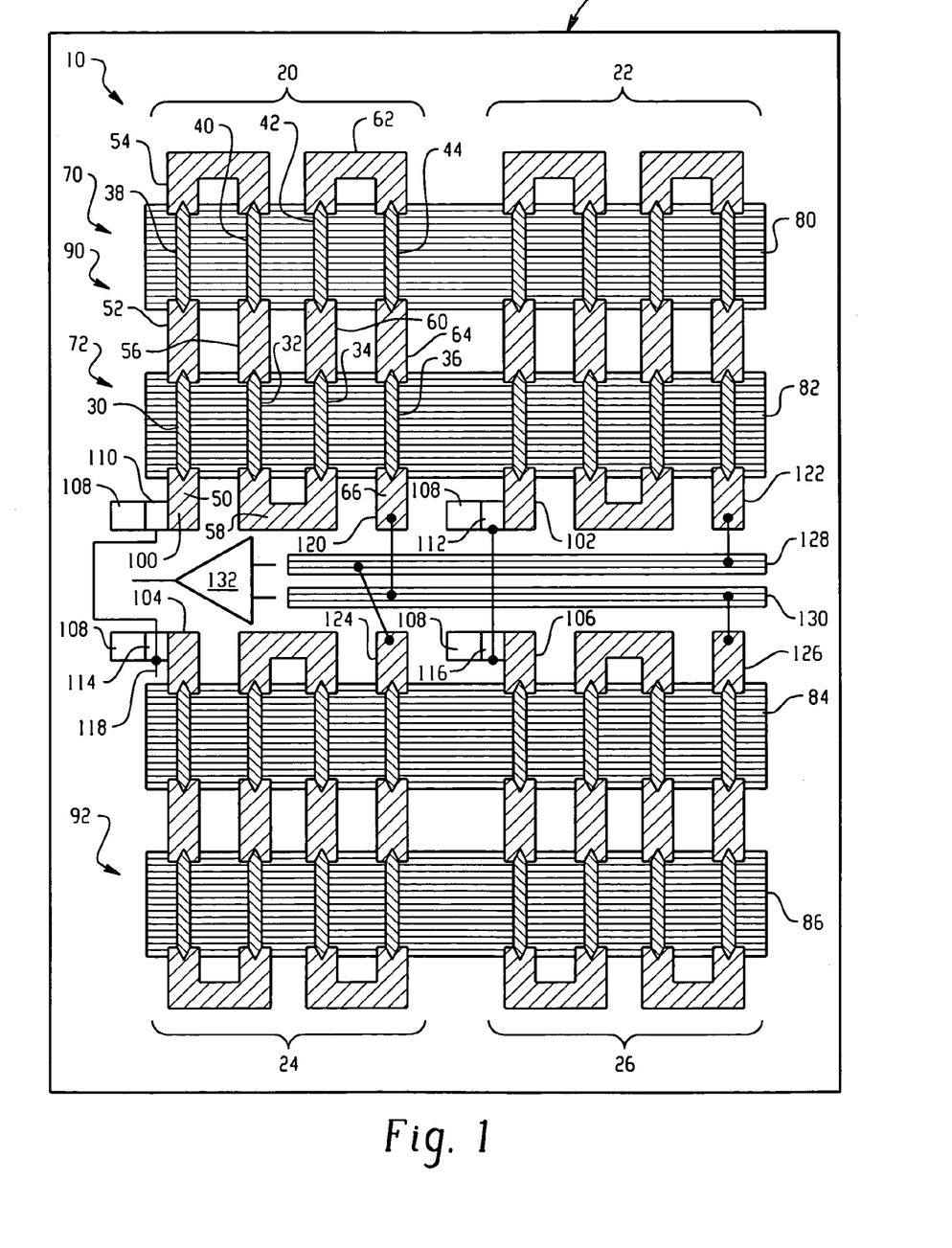
FIG. 1 shows a top view of an MRAM segment utilizing preferred methods according to the preferred teachings of the present invention, with portions of the MRAM structure removed to show details of the noise stabilization and reduction apparatus of the present invention.

A top view of an MRAM segment having optimized circuit performance, according to the preferred teachings of the present invention, is shown in FIG. 1 and is generally designated 10. Portions of the MRAM structure shown in FIG. 1 have been removed to show details of the apparatus of the present invention. Those skilled in the art will be aware that MRAM chips contain other structures and layers, such as a transistor layer that may be formed from polysilicon and a metal connect layer. These elements have been removed for the sake of clarity. The MRAM 10 is shown on a wafer 9 but could be also independent from the wafer 9 as is conventionally known.

The MRAM segment includes a plurality of sense strings 20, 22, 24, 26. Each sense string 20, 22, 24, 26 includes one or more sub bits 30, 32, 34, 36, 38, 40, 42, 44 connected by strap layer segments 50, 52, 54, 56, 58, 60, 62, 64, 66. In the preferred embodiment of the present invention, the strap layer segments 50, 52, 54, 56, 58, 60, 62, 64, 66 connect the sub bits 30, 32, 34, 36, 38, 40, 42, 44 in series. In further aspects of the preferred embodiment, the structure of the sense strings 20, 22, 24, 26 have a serpentine conformation. In this conformation, groups of two sub bits 30, 32, 34, 36, 38, 40, 42, 44 form linear components. The strap layer segments 50, 52, 54, 56, 58, 60, 62, 64, 66 provide connection elements to join the sub bits 30, 32, 34, 36, 38, 40, 42, 44 into these linear components. Four of these linear components are located parallel to one another. The strap layer segments 50, 52, 54, 56, 58, 60, 62, 64, 66 also provide connection elements to join the linear components at alternating ends in order to connect the sub bits 30, 32, 34, 36, 38, 40, 42, 44 in series. In the preferred embodiment, the sense strings 20, 22, 24, 26 include eight sub bits 30, 32, 34, 36, 38, 40, 42, 44 connected in series. In an alternative embodiment, the sense strings 20, 22, 24, 26 may make up a single sub bit. Different numbers of sub bits and as well as different arrangements of the sub bits may be employed without departing from the spirit and scope of the invention.

The sub bits 30, 32, 34, 36, 38, 40, 42, 44 include the data storage element of the MRAM segment 10. These sub bits 30, 32, 34, 36, 38, 40, 42, 44 may also be termed "memory spots" or "memory elements". In the preferred embodiment, the sub bits or memory spots 30, 32, 34, 36, 38, 40, 42, 44 are grouped in fours, where the upper four memory spots 38, 40, 42, 44 make up an upper bit 70 and the lower four memory spots 30, 32, 34, 36 make up a lower bit 72.

The MRAM segment 10 employs a word line 80, 82, 84, 86 to address a selected bit 70, 72. In the preferred embodiment, the MRAM segment 10 uses two word lines 80, 82 to address the sense strings 20, 22, 24, 26, with an upper word line 80 addressing the memory spots 38, 40, 42, 44 of the upper bit 70 and a lower word line 82 addressing the memory spots 30, 32, 34, 36 of the lower bit 72. The upper word line 80 intersects each of the upper sub bits 38, 40, 42, 44 so that a sense current passing through the upper sub bits 38, 40, 42, 44 is orthogonal to a word current passing through the upper word line 80. Likewise, the lower word line 82 intersects each of the lower sub bits 30, 32, 34, 36 so that a sense current passing through the lower sub bits 30, 32, 34, 36 is orthogonal to a word current passing through the lower word line 82. Serial connection of the memory spots 30, 32, 34, 36, 38, 40, 42, 44 combined with activation of the word line 80, 82, 84, 86 corresponding to a selected bit 70, 72 allows each sub bit 30, 32, 34, 36, 38, 40, 42, 44 of the selected bit 70, 72 to contribute proportionally to the signal size.

As those skilled in the art will understand, other conformations of the sense strings 20, 22, 24, 26 may be employed without departing from the spirit or scope of the invention. In the four memory spot bit described above, each memory spot, or sub bit 30, 32, 34, 36, 38, 40, 42, 44 is designed to have length to width ratio providing for consistent switching characteristics. In one aspect of the invention, the number of memory spots 30, 32, 34, 36, 38, 40, 42, 44 per bit 70, 72 is designed to provide a selected signal size. In another aspect of the present invention, the number of memory spots 30, 32, 34, 36, 38, 40, 42, 44 per bit 70, 72 is designed to provide redundancy in the event of a defective bit. The defective bit may be the result of a manufacturing defect or operational failure. The MRAM may be advantageously designed to have functional bits with only three of four memory spots operational. In another embodiment, the MRAM may be advantageously designed to have functional bits with only two of three memory spots operational.

In other aspects of the present invention, the multiple memory spots 30, 32, 34, 36, 38, 40, 42, 44 of the bit 70, 72 may be addressed by a single word line 80, 82, 84, 86 to conserve power and allow a higher density of bits 70, 72; or alternatively, multiple word lines 80, 82, 84, 86 may be used to address the multiple memory spots 30, 32, 34, 36, 38, 40, 42, 44 of the bit 70, 72 when more memory spots 30, 32, 34, 36, 38, 40, 42, 44 are desired to obtain a stronger signal to noise ratio or a higher level of redundancy.

In a typical MRAM structure, an array 90 of sense strings includes multiple sense strings 20, 22 positioned adjacent to one another in a linear arrangement. These sense strings 20, 22 have the same general shape, so that the word line 80, 82 may address the sub bits 30, 32, 34, 36, 38, 40, 42, 44 of each sense string in the array 90. In one preferred embodiment, the array 90 includes thirty-three sense strings 20, 22 that may each be addressed by the upper word line 80 and the lower word line 82. As those skilled in the art will understand, the word line 80, 82 may address more or fewer sense strings 20, 22 without departing from the spirit or scope of the present invention. The sub bits 30, 32, 34, 36, 38, 40, 42, 44 of each sense string 20, 22 must be positioned so that a sense current passing through the sub bits 30, 32, 34, 36, 38, 40, 42, 44 is orthogonal to a word current passing through the word line 80, 82.

Each sense string 20, 24 has an input end 100, 102, 104, 106 connected to a voltage source 108 through a switch 110, 112, 114, 116. A transistor may serve as the switch 110, 112, 114, 116. A signal 118 triggers the switch 110, 112, 114, 116 of a selected sense string 20, 22, 24, 26 to allow a sense current to pass through the respective sense string 20, 22, 24, 26. Each sense string 20, 22, 24, 26 also has an output end 120, 122, 124, 126 connected to a sense line 128, 130. In the preferred form, the MRAM segment 10 includes two sense lines, an upper sense line 128 and a lower sense line 130, respectively. The MRAM segment 10 further includes two arrays 90, 92 of sense strings 20, 22, 24, 26, an upper array 90 positioned above the two sense lines 128, 130 and a lower array 92 positioned below the two sense lines 128, 130.

The MRAM segment 10 of the preferred form of the present invention provides for noise stabilization and reduction through the coupling of the respective output ends 120, 122, 124, 126 of the sense strings of the upper array 90 and the lower array 92. In one example embodiment, shown in FIG. 1, the output end 120, 122 of each of the sense strings 20, 22 of the upper array 90 is connected alternately to the upper sense line 128 and the lower sense line 130. Thus, in this example embodiment, sense string 20 is connected to the lower sense line 130, and sense string 22 is connected to the upper sense line 128. Likewise, the output end 120, 122, 124, 126 of each of the sense strings 24, 26 in the lower array 92 is connected alternately to the upper sense line 128 and the lower sense line 130. In this example embodiment, sense string 24 is connected to the upper sense line 128 and sense string 26 is connected to the lower sense line 130. This pattern of coupling the output ends 120, 122, 124, 126 of the sense strings 20, 22, 24, 26 continues for each of the sense strings 20, 22, 24, 26 in the arrays 90, 92. Those skilled in the art will understand that other patterns of coupling the output ends 120, 122, 124, 126 of the sense strings 20, 22, 24, 26 may be employed without departing from the spirit or scope of the present invention.

The upper sense line 128 and the lower sense line 130 provide the signal from the sense strings 20, 22, 24, 26 to a differential amplifier 132. The differential amplifier 132 detects the voltage difference in the signal provided by the upper sense line 128 and the lower sense line 130. Determination of the state of a selected bit makes use of the output of the differential amplifier 132.

Figure 2A:
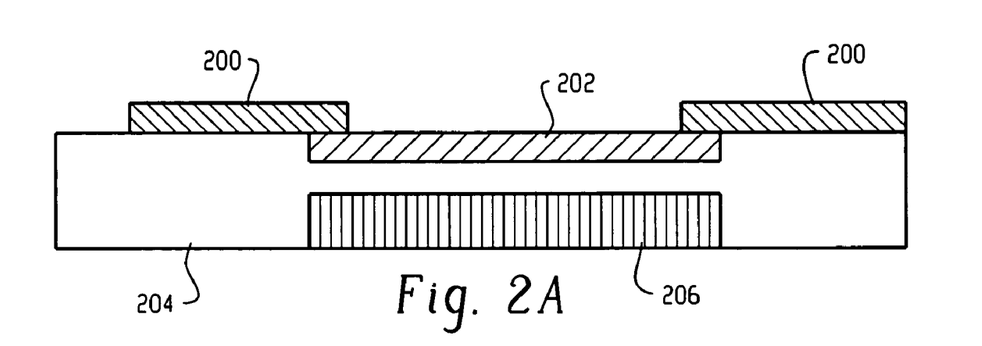
FIG. 2A shows an end view of a sense string and word line, with portions of the MRAM structure removed to show details of the structure of the sense string and word line.
Figure 2B:
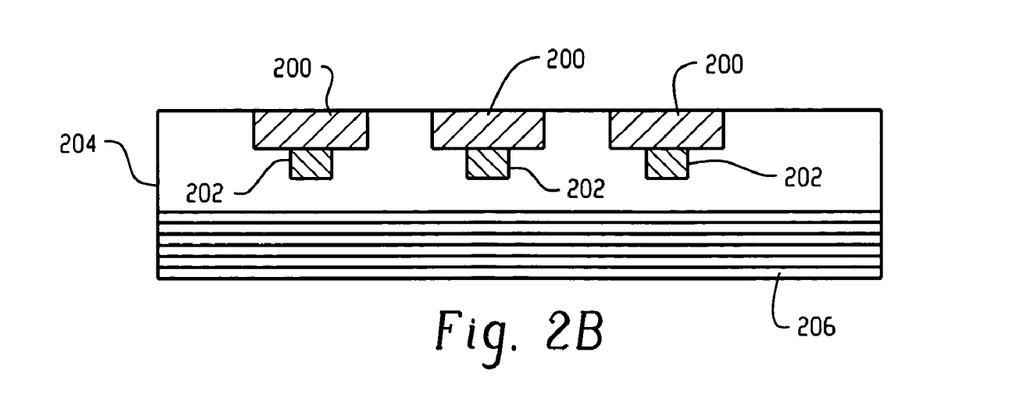
FIG. 2B shows a side view of a sense string and word line, with portions of the MRAM structure removed to show details of the structure of the sense string and word line.

FIGS. 2A and 2B show an end view and a side view, respectively, of a sense string 20, 22, 24, 26 and word line 80, 82, with portions of the MRAM structure removed to show details of the structure of sense string 20, 22, 24, 26 and word line 80, 82. The MRAM segment 10 has a strap layer 200 and a bit layer 202 embedded within a dielectric layer 204. The dielectric layer 204 also serves as an insulating layer 204. The sub bits 30, 32, 34, 36, 38, 40, 42, 44 are formed from sections of the bit layer 202 embedded within the dielectric layer 204. As shown in FIGS. 2A and 2B, the strap layer 200 overlies the bit layer 202. The strap layer 200 provides connection elements between the sub bits 30, 32, 34, 36, 38, 40, 42, 44. Overlap between the strap layer 200 and the sub bits 30, 32, 34, 36, 38, 40, 42, 44 provide contact between the strap layer 200 and the sub bits 30, 32, 34, 36, 38, 40, 42, 44. The word lines 206 are also embedded within the dielectric layer 204, and in the preferred form, the sense strings 20, 22, 24, 26 overlie the word lines 206. The conformation of the word lines 206 and the sense strings 20, 22, 24, 26 become a source of capacitive coupling. Furthermore, in order to present a substantially uniform field to the sub bits 30, 32, 34, 36, 38, 40, 42, 44, the length of the sub bits may be limited to the width of the word lines 206.

The present invention provides for a greater signal differential by employing multiple sub bits 30, 32, 34, 36, 38, 40, 42, 44 for each bit 70, 72. The memory spots for each bit are set to have the same magnetization state. Thus, in a high resistance state, or "0" state, the difference in resistance from a low resistance state, or "1" state, will be proportional to the number of memory spots 30, 32, 34, 36, 38, 40, 42, 44 in a bit 70, 72. In the preferred embodiment, sub bits 30, 32, 34, 36 and sub bits 38, 40, 42, 44 each make up one bit 70, 72, respectively. By connecting these memory spots 30, 32, 34, 36, 38, 40, 42, 44 in series, the example embodiment shown provides a signal having a voltage drop four times the magnitude that would be provided from a single memory spot. More or fewer memory spots or sub bits 30, 32, 34, 36, 38, 40, 42, 44 may be employed for each bit 70, 72 to provide a signal having a desired magnitude.

The present invention also provides for a greater memory capacity by employing multiple groups of sub bits 30, 32, 34, 36, 38, 40, 42, 44 on each sense string 20, 22, 24, 26. Each group of sub bits 30, 32, 34, 36, 38, 40, 42, 44 on the sense string 20, 22, 24, 26 make up a separate bit 70, 72 and has a separate word line 80, 82, 84, 86 so that each group of sub bits 30, 32, 34, 36, 38, 40, 42, 44 may be addressed separately. In the preferred embodiment of the present invention, the upper word line 80 addresses upper sub bits 38, 40, 42, 44 and the lower word line 82 addresses lower sub bits 30, 32, 34, 36. A word current through either word line 80, 82 addresses the respective sub bits while not appreciably changing the resistance of the other sub bits. More or fewer groups of sub bits may be employed without departing from the scope of the present invention.

The MRAM queries the state of a bit using a sense current and a word current. By way of example, and not limitation, determination of the lower bit 72 begins by sending a signal that triggers the switches 110, 114 for the first sense string 20 and the reference sense string 24. This allows a sense current from voltage source 108 to flow through each respective sense string 20, 24. Concurrently, the MRAM applies a word current through the lower word line 82 of the upper array 90. All other sense strings 22, 26 and word lines 80, 84, 86 remain inactive. The magnetic field from the word current change the resistance of the sub bits 30, 32, 34, 36 to the sense current. By way of example, the current through the sense strings 20, 24 can be on the order of 3–5 milliamps and the current passing through the word line 82 can be on the order of 40–50 milliamps. These values are representative and may vary.

In the foregoing example, the lower sense line 130 receives the sense current from the sense string 20 and serves as a reference sense line. A second sense string, reference sense string 24, acts as a reference for sense string 20 and provides a reference signal unaffected by a word current. An upper sense line 128 receives the sense current through sense string 24. In a similar fashion, when the MRAM segment 10 addresses a bit on sense string 24, sense string 20 may serve as a reference. The differential amplifier 132 samples the signals from the upper sense line 128 and the lower sense line 130. The differential amp 132 includes circuitry to employ an auto zero technique that locks in the difference of the signals from the upper sense line 128 and the lower sense line 130 as a base value. The current on the word line 82 is then reversed, causing the resistance of the memory spots 30, 32, 34, 36 to change because of the change of the magnetic field generated by the word line 82. The differential amplifier 132 then samples the signals from the upper sense line 128 and the lower sense line 130 again and provides the results to a comparator. The differential amplifier 132 further includes a comparator to determine the state of the lower bit 72.

In the foregoing example, the differential amplifier 132 receives a signal from the sense string 20 on the lower sense line 130 and a signal from reference sense string 24 on upper sense line 128. However, in addition to the signal from the sense current passing through the sense string 20, the current from the word line 82 has a capacitive interconnect with the sense string 20 and each of the sense strings 22 in the same array as the sense string 20. The capacitive interconnects generate a significant amount of noise in comparison to a bit component of the signal from the sense string, comprising up to fifty percent of the bit component. Furthermore, the noise generated by the capacitive interconnects between the word line 82 and the sense strings 20, 22, 24, 26 vary between each sensing event. Also, the noise is proportional to the number of sense strings 20, 22 in the array 90. Thus, as the array size increases, the amount of noise due to capacitive interconnects increases proportionally. These noise levels are a major impediment to development of fast and reliable MRAM applications. With increasing MRAM array sizes, these hindrances are exacerbated.

The MRAM segment 10 according to the preferred teachings of the present invention stabilizes and reduces noise generated by these capacitive interconnects. By coupling a first portion of each array 90 of sense strings to the upper sense line 128 and a second portion of each array 90 of sense strings 20, 22, 24, 26 to the lower sense line 130, the MRAM segment 10 reduces the amount of noise seen by each sense line 128, 130 proportional to the portion of sense strings 20, 22, 24, 26 coupled to the other sense line 128, 130. In the preferred embodiment, alternating sense strings 20, 22, 24, 26 in an array 90, 92 are coupled the upper sense line 128 and the lower sense line 130, respectively, reducing the amount of noise from capacitive coupling by approximately fifty percent. MRAM segment 10 according to the preferred teachings of the present invention also stabilizes the effect of noise through cross coupling of the sense strings 20, 22, 24, 26. The cross coupling of the sense strings 20, 22, 24, 26 balances the noise generated in the sense strings 20, 22, 24, 26 by activation of the word line 80, 82 between the upper sense line 128 and the lower sense line 130.

Figure 3:
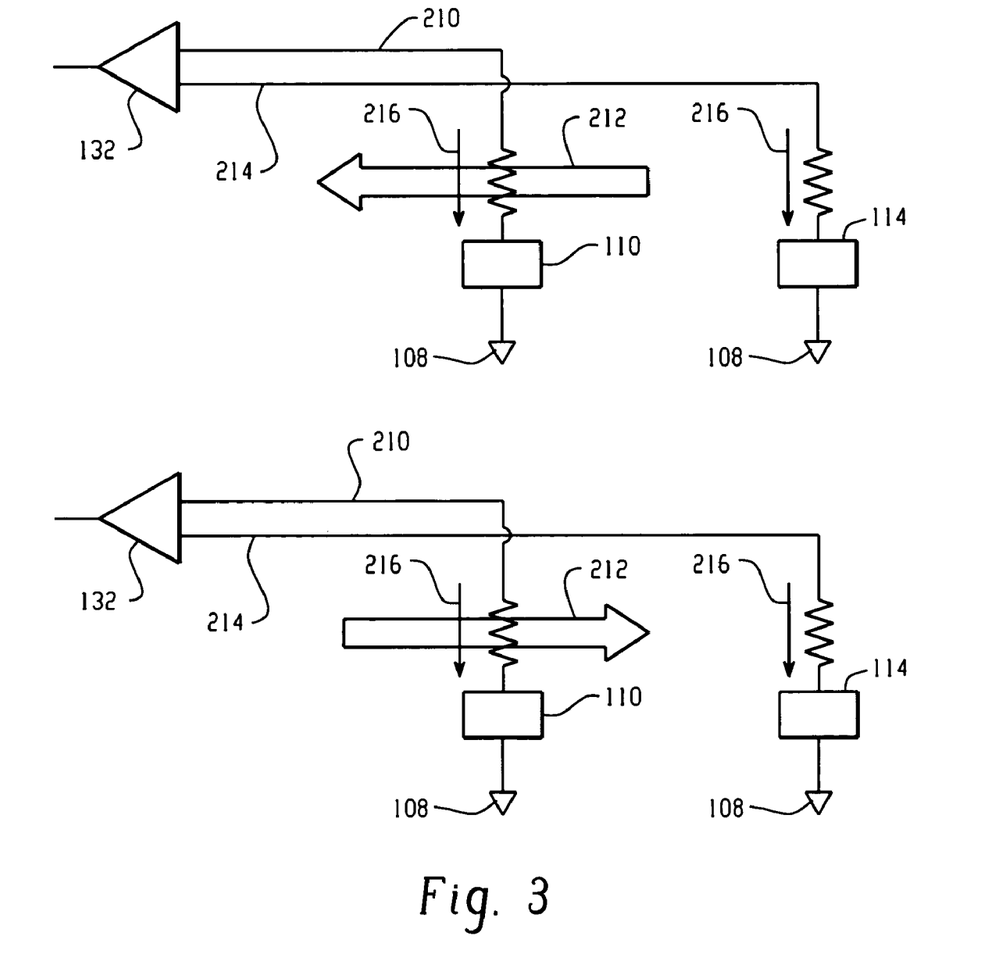
FIG. 3 shows a simplified circuit seen by the differential amplifier utilizing preferred methods according to the preferred teachings of the present invention with a sense string and a word line active.

FIG. 3 shows a simplified circuit seen by differential amplifier 132 with the sense string 20 and the word line 82 active. At one input, the differential amplifier 132 receives the sense signal 210 from a sense string 20 having an active word line 82 with a word current 212. The other input receives a reference signal 214 from the reference sense string 24. Both the sense signal 210 and the reference signal 214 include a sense current 216 and a noise current injected by the capacitive coupling. The difference seen by the differential amplifier 132 is now largely due to the different voltage drop across the sense string 20 with the active word line 82 because of the different resistance to the sense current 216. A second signal can be obtained by reversing the word current 212.

Figure 4:
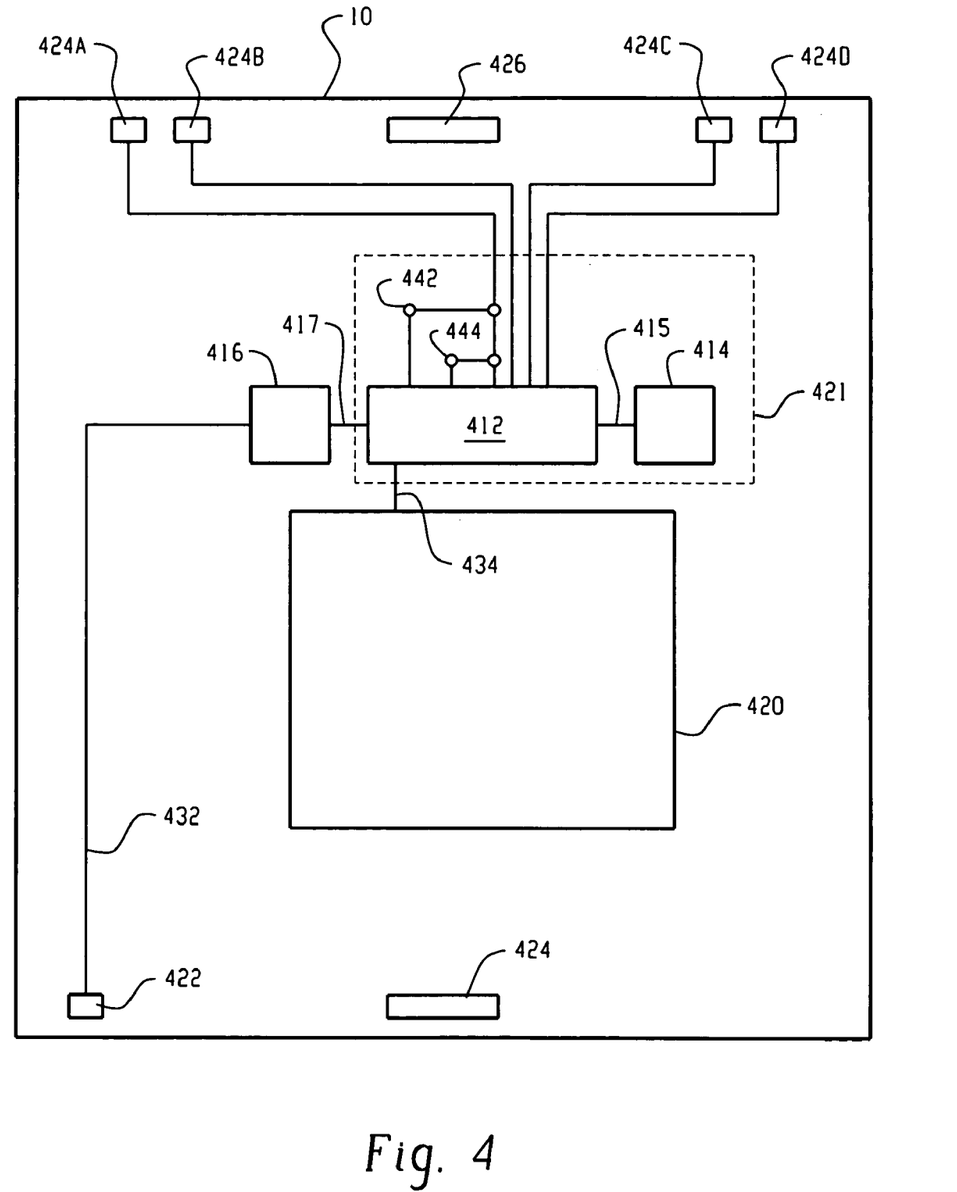
FIG. 4 shows a circuit schematic of an MRAM with a stable reference current generator, core electronic and indicator circuit according to the preferred teachings of the present invention.

Refer now to FIG. 4 which shows a circuit schematic of an MRAM with a stable reference current generator, core electronics, and indicator circuitry, according to the preferred teachings of the present invention.

The MRAM 10 is shown in the FIG. 4 with some standard MRAM circuitry 420 receiving word bias reference current 434 from bias circuitry 412 that is tunable. The bias circuitry 412 provides a stable reference to the MRAM 10. The bias circuitry 412 sets the reference levels used by the standard MRAM circuitry 420. The bias circuitry 412 sets the operation range of the MRAM 10 and is connected to the indicator circuitry 416.

Indicator circuitry 416 provides an indicator current line 432 to external pad 422 and receives a bias circuitry signal 417 from the bias circuitry 412. This indicator circuitry 416 is designed to send out a ratio or a duplicate of internal operation points and is connected to exterior pad 422 for ease in test and evaluation after fabrication of the MRAM is complete. The indicator circuitry 416 comprises current mirrors that send out signals to the exterior pad 422. The exterior pad 422 provides a method to access the operating points of the bias circuitry 412 for an individual die. A current mirror outputs to the exterior pad 422, for example; a current mirror low. To test the MRAM 10, an external low resistive load of low to high is placed on pad 422, and then the current that is sent out of pad 422 is measured. This gives an accurate indicator of the current bias, where the bias current is a reference for the word current 212, or sense current 216, or both. Those skilled in the art will recognize that more or fewer signals can be tested using the preferred teachings of the invention. According to the preferred teachings of the present invention, the signals being measured are from 15, 25, 50, 80 and 100 microamps by way of example and not limitation.

In controlling the operation of the MRAM 10, only small variations from the desired operation conditions are preferred. Ordinary changes in fabrication may require different operational biases and associated references than an MRAM 10 circuitry provides. For example, the word current 212 may need to be 30 milliamps on one part or 34 milliamps on another on the same wafer during a write. To compensate for these differences, it is desirable to have the ability to change the default setting level of the bias circuitry 412. The bias circuitry 412 can then be altered to match the required operation point. For example, the operation point could be the word current 212 magnitude or the sense current 216 magnitude. To measure and control these changes, indicator current line 432 is routed to exterior pad 422, to show the manufacturing variances. To achieve this goal, the bias circuitry 412 can modify the output of the bias setting circuitry 414 after fabrication is complete because the bias setting circuitry 414 may not have the precision over the manufacturing range to set it without testing the resultant changes.

Then, the variable current or timing settings can be altered by the bias setting circuitry 414 to set bias circuit levels to optimize circuit performance of the sensitive circuits of the MRAM 10. For example, these sensitive circuits, such as stable reference circuitry 421 can be the current references that control the word current 212 magnitude and sense current 216 magnitude of the MRAM 10.

An MRAM 10 has sensitive analog amplifiers and current sources in standard MRAM circuitry 420 that need their operation confined to a small range. This range can vary based on the manufacturing results which may change widely. To control the operation point for the range of the circuitry, the stable reference circuitry 421 is used with its indicator current line 432 to set this operation point. While this stable reference circuitry 421 can stabilize the control of the MRAM 10 over temperature and voltage variations, it may not adequately adapt to manufacturing process variations. Since the manufacturing processes may change or be improved or since the bit storage element 38, 42, 44 may be modified for improvement, it is valuable to be able to have the ability to modify the MRAM's operational settings.

To verify the setting of the MRAM 10 operational range, both before and after any changes to this range, indicator circuitry 416 is included. This indicator circuitry 416 makes indicator current line 432 available to be routed to outside pad 422 for test purposes. According to the preferred teachings of the present invention the indicator current line 432 is either the duplicate of an internal operation value or a ratio of such an operation point. By having testability of these critical settings available at the external pad 422, ranges can be reliability set. If a MRAM 10 tests out of specification as is known in the art, as it comes from manufacturing, it could be improved afterward by modifying settings with the bias circuitry 412. Under these conditions, the yield from manufacturing could be improved which reduces the cost per chip and hence increases profitability.

These testability features reduce test effort, time and hence cost. By checking that an MRAM 10 is operating within an acceptable range, it can be determined that it is a good candidate for further test effort. If an MRAM 10 is not operating in an acceptable range, the test could be terminated immediately and the MRAM 10 could be marked as bad or in need of a setting change before expending further test time, effort and cost on that chip. Since test time and cost can be large in relation to the final selling price, reducing test time in this way could increase profitability for MRAM manufacturers.

The methodology is isolation of the sensitive internal signals in stable reference circuitry 421 from possibly being influenced by the testing process. Since this is a concern, the internal signals can be ratioed or duplicated through indicator circuitry that isolates these internal signals from external influences. For example, the current gain between transistor 464 and transistor 454 can be set to any desired amount by varying the relative gain between them in a well known manner.

Input/output pads 424A, 424B, 424C and 424D provide access to and allow control of the MRAM 10 in a well-known manner. A ground pad 424 is provided on the bottom of the MRAM 10 and a power pad 426 is provided on the top of the MRAM 10 that provides power and ground for all devices on the MRAM 10. According to the preferred teachings of the present invention the ground pad is a Vss pad and the power pad is a Vdd pad.

The standard MRAM circuitry 420 uses a stable bias, or is digital, and includes the core electronics, control electronics, the sense and word current sources and delay circuitry. The delay circuitry is also compensated for with the bias, so that a relatively stable timing over voltage supply range and over temperature range can be maintained. The bias circuitry 412 provides a stable reference to the MRAM 10.

Figure 5:
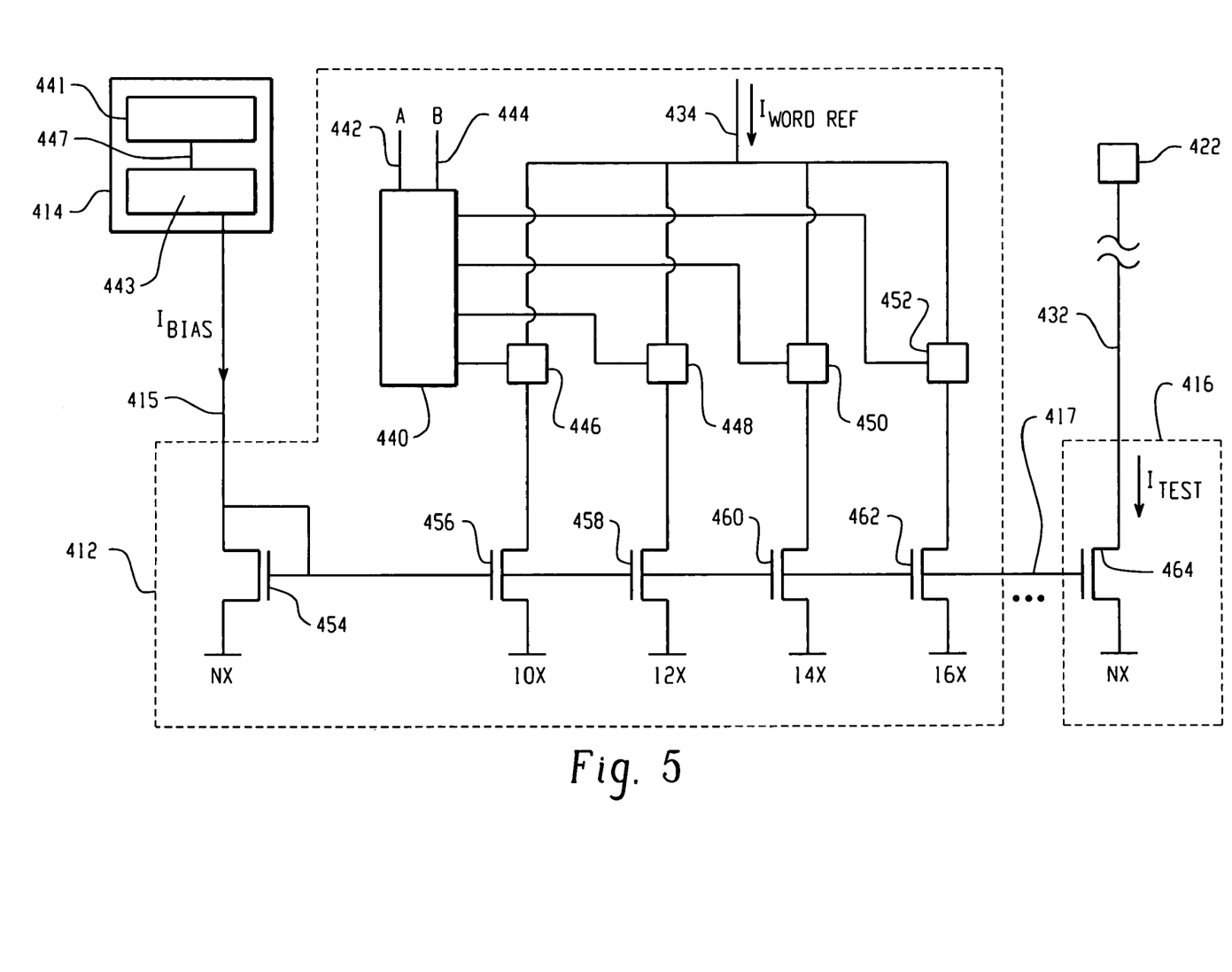
FIG. 5 shows a circuit schematic of a bias/reference circuitry, the bias setting circuitry and indicator circuitry and external pad according to the preferred teachings of the present invention.

Refer now to FIG. 5 which shows the global bias setting circuitry 414, the bias circuitry 412, and indicator circuitry 416. Bias circuitry 412 optimizes the bias level set initially by bias setting circuitry 414.

The bias setting circuitry 414 has a stable voltage reference 441 such as a band gap or other suitable circuit that provides a stable voltage or compensated voltage over temperature. The stable voltage source 441 provides a voltage 447 to a stable current source 443 such as a voltage and process compensated current supply.

The bias setting circuitry 414 that is associated with the bias can be modified by laser trimming of fuses or other devices to optimize bias outputs in a well-known manner. The bias setting circuitry 414 sets the circuit levels for optimizing the MRAM 10. The bias setting circuitry 412 includes circuitry for modifying and fine-tuning the operation of the MRAM 10. This is necessary because during manufacture, the underlying circuitry has a normal variation, from variations in active device operation, such as the MRAM's transistors. For example this variation may be across a 20% range. The bias circuitry 412 tunes this to a 1%–2% range per die or per wafer because processing or fabricating variations have been tuned out. The global bias setting circuitry 414 provides the global bias signal 415.

The stable reference circuitry 421 includes the bias setting circuitry 414 driving the bias signal 415. The bias signal 415 represents the stable operating point of the MRAM 10. The bias signal 415 is provided to the bias circuitry 412. The bias circuitry 412 provides the bias tuning signal 417 to the indicatory circuitry 416.

Transistor 454 is a mirror input for the bias signal 415. This provides a basis for multiplying the bias signal 415 using transistors 456, 458, 460 or 462. Each gate on transistors 456, 458, 460 or 462 is connected by bias tuning signal 417 to the gate of transistor 454 in a mirror configuration.

Specific selection of a particular mirror transistor 456, 458, 460 or 462 is done by switches 446, 448, 450 or 452 as decoded by decoder 440. Decoder 440 is controlled by select signal 442 and 444. The switches will connect only one of the outputs of transistors 456, 458, 460 or 462 to the word bias reference current 434.

The bias setting circuitry 414 provides a stable signal 415 over temperature and voltage to bias circuitry 412 which generates the word bias reference current 434 that is selected by signal 442 and signal 444. Signals 442 and 444 can be set externally on pads 424A, 424B 424C and 424D, or by chip defaults as is conventionally known. The bias circuitry 412 also outputs the bias tuning signal 417 to the indicator circuitry 416. The word bias reference current 434 is generated from the bias signal 415 and the select signal 442 and 444 and feeds into the standard decoder 440 where word bias reference current 434 is used to set the magnitude of word current 212, a sense current 216 or any other signal. Each signal desired to be tuned needs a duplicate stable reference circuitry 421 to drive its bias as well as indicator circuitry 416 and test pad 422. The indicator circuitry 416 is connected to an external pad 422 that, when placed in test mode, will supply the indicator current line 432 that is proportional to the word bias reference current 434. The indicator circuitry 416 is placed in test mode by driving the pad 422 to a high state, or VDD, and indicates the current supplied by the indicator circuitry 416. Each word bias reference current 434 needs its own set of select stable reference circuitry 421.

For example, if the desired test is for 14 times the bias reference signal the select signal 442 and 444 would be "10" indicating the switch 450, implemented as a transistor, would activate the word bias reference current 434 to allow transistor 460 to drive the word bias reference current 434.

In operation during manufacturing, one or more die could be tested on a wafer, and from this testing, the correct bias settings can be determined and applied to all die on the wafer. Then, each die on the wafer could be laser trimmed by laser trimming fuses on the die. This process increases wafer yield by optimizing the operation of the delay circuitry or the current sources, either the word current source or sense current source.

Circuitry is provided to change the levels using a register that can be changed. The test/optimization cycle involves changing the settings and testing the MRAM. A shift register method is used to set where the bias is. The bias can be set using conventional methods or as shown with reference to FIGS. 7, 8 and 9.

Figure 6:
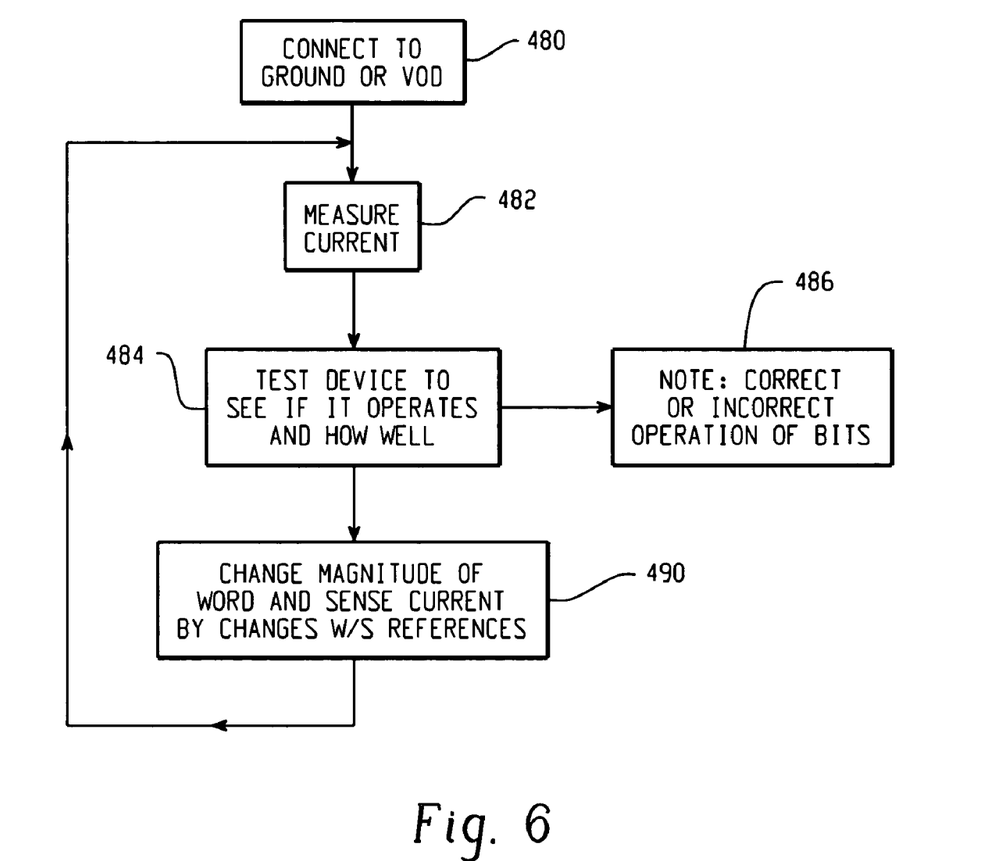
FIG. 6 shows a method to test an MRAM and set MRAM operating points according to the preferred teachings of the present invention.

Refer now to FIG. 6 which shows a method to test and set operating points on an MRAM 10. As diagrammatically indicated in 480, the test pad 422 is connected to either VDD or ground depending on how the indicator circuitry is configured. For example, on N-channel transistor 416, the test pad 422 is connected to VDD, and for a P-channel transistor 416, the test pad 422 is connected to VSS or ground. Next, the current in indicator current line 432 is measured, as diagrammatically indicated in 482, by using well known external current measuring devices such as automated current meter in test equipment. The MRAM 10 is tested, as diagrammatically indicated in 484, to determine if the correct logical operation of the device by writing and reading back data to the MRAM 10. The current in indicator current line 432 and the memory operation is noted, as diagrammatically indicated in 486. Then, the magnitude of the word current 212 is tuned, as diagrammatically indicated in 490, by adjusting the word bias reference current 434 using the bias circuitry 412 by selecting the desired setting or range of settings using the select signals 442 and 444 and producing the bias tuning signal 417. Then the test sequence is repeated as often as desired until all desired operating points are set and recorded.

The best setting for the MRAM 10 on a particular wafer is noted by determining the most consistent and accurate results by writing and reading the MRAM 10. Then, the other operating points of the MRAM 10 can utilize the best operating point discovered by the procedure according to the preferred teachings of the present invention, for the portion of the MRAM 10 or wafer or batch that this MRAM 10 represents.

Thus, the operating point of the MRAM 10 is adjusted for variations in production and manufacturing.

Figure 7:
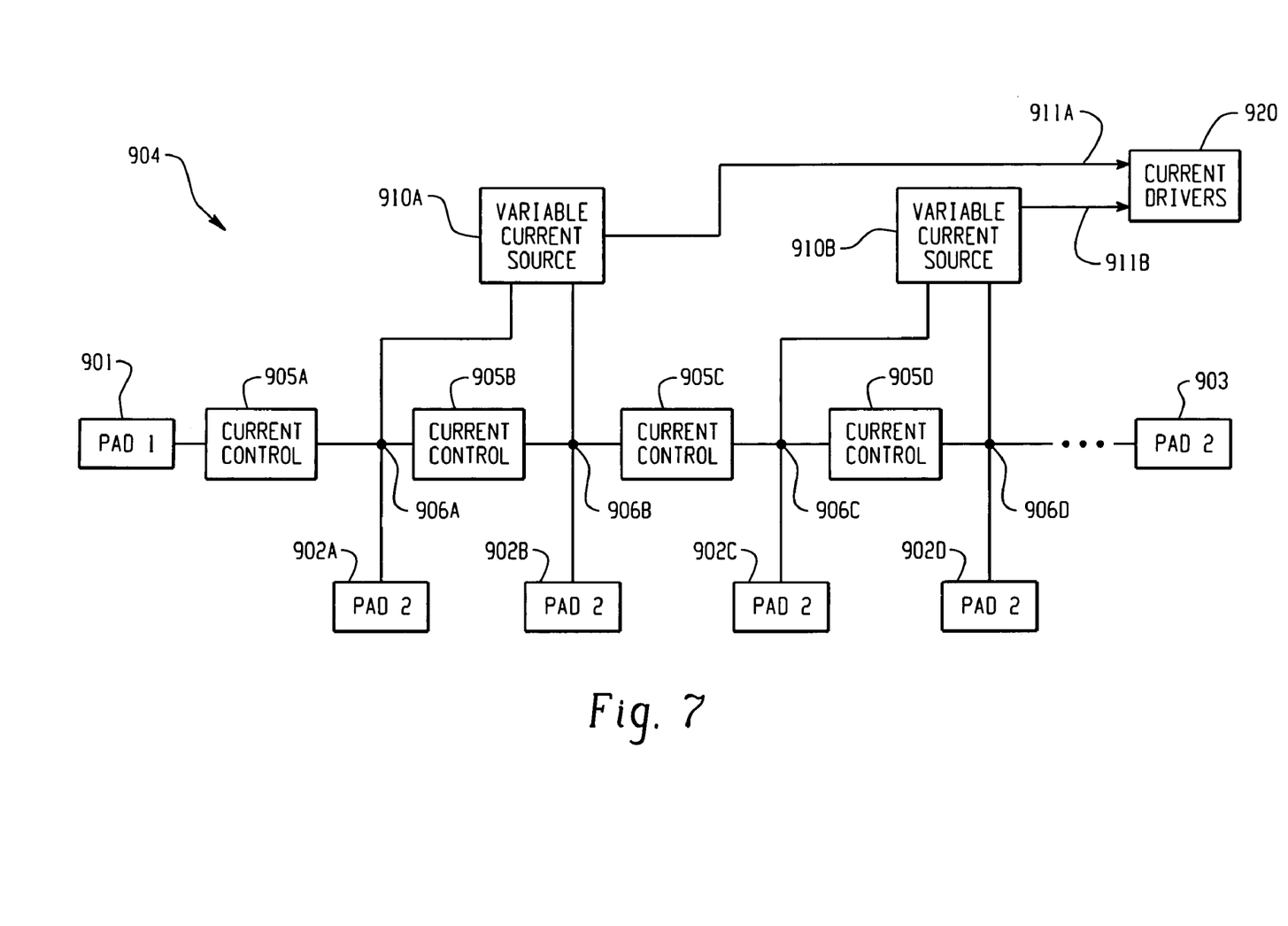
FIG. 7 shows a schematic circuit diagram of a variable current source circuit system embedded in a magnetoresistive random access memory integrated circuit (MRAM IC) as contemplated by the present invention.

Referring now to FIG. 7, there shown schematically is a variable current source circuit system 904 embedded in a magnetoresistive random access memory integrated circuit (MRAM IC). The variable current source circuit system 904 provides a current signal that is an example of the word bias reference current 434. The variable current source circuit system includes a plurality of current control circuits 905A, 905B, 905C, and 905D, wherein each current control circuit 905A, 905B, 905C, and 905D generates a current source control signal at nodes 906A, 906B, 906C, and 906D. A plurality of variable current source circuits 910A, 910B are each connected to receive at least two current source control signals. Each of said plurality of variable current source circuits 910A, 910B has an output 911A, 911B for transmitting a variable current to at least one MRAM current driver 920 connected to receive the variable current. The MRAM current driver may advantageously be one of a word current driver for reading or a word current driver for writing to an MRAM memory cell.

In a useful embodiment, the variable current source circuits 910A, 910B each receive at least two binary control signals from the nodes 906A, 906B, 906C, and 906D. Those skilled in the art and having the benefit of this disclosure will understand that the number of control inputs and current source control circuits may vary for a variable current source element to provide different current granularity and range, for example.

In one example embodiment useful for a testing vehicle, an initial control signal may be impressed upon a first conduction pad 901 and input into a first current control 905A. The external pad 901 is driven off chip. The input signal on pad 901 determines the state values scanned into each current control circuits 905A, 905B, 905C and 905D. A plurality of read out elements, such as, for example, conductive pads 902A, 902B, 902C and 902D, 903 may optionally be used to provide signal information at the nodes 906A, 906B, 906C, and 906D. In one example embodiment, the plurality of current control circuits 905A, 905B, 905C, and 905D may advantageously be arranged in a scan fashion. The scan fashion arrangement comprises a series arrangement of each of the current control circuits 905A, 905B, 905C, and 905D wherein the output of each of the plurality of current control circuits is coupled to the input of a subsequent one of the plurality of current control circuits 905A, 905B, 905C, and 905D. Each stage of the register scan chain may be optionally wired to an external pad if desired. For example, values out of current control circuit 905A can be revised on external pad 902A and values can be scanned into current control circuit 905B from pad 902A.

Where the MRAM IC is intended to be a test vehicle, extra external pads are advantageously provided to increase the testability and observability of a circuit and to provide extra monitoring points. Where the MRAM IC is intended to be a production part, the number of bonded pads can be reduced. One way to reduce the number of external pads while maintaining the level of testability and observability is to use internal storage registers organized in a scan arrangement. This scan register chain can be used in the MRAM such that all the controlling binary signals of the individual current source elements may be set and scanned in series from one single external pad, such as pad 901.

Figure 8:
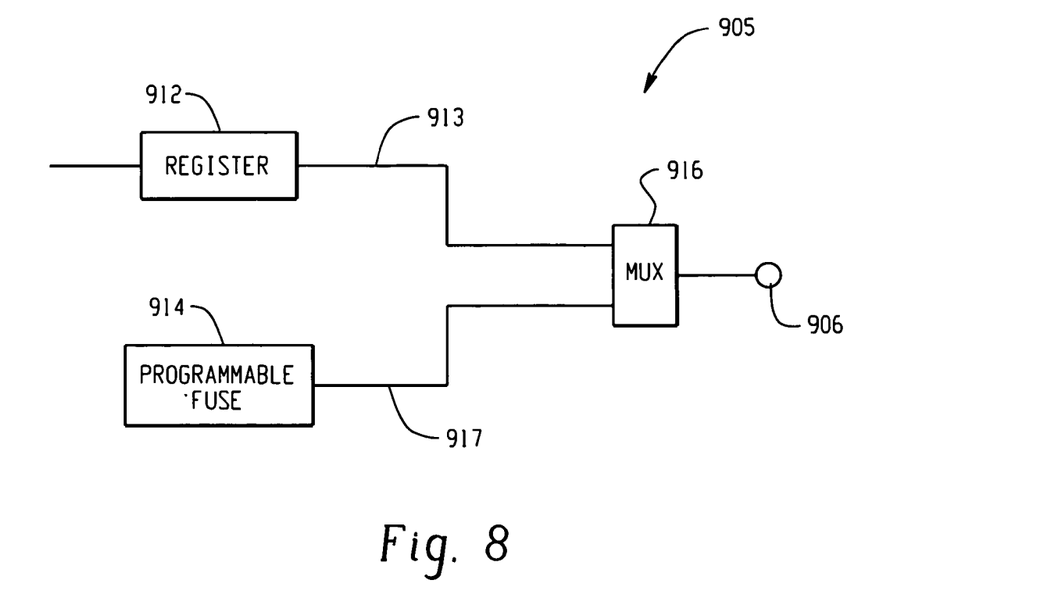
FIG. 8 shows a schematic circuit diagram of an example of a current control circuit for a variable current source circuit system embedded in an MRAM IC as contemplated by the present invention.

Referring now to FIG. 8, there shown schematically is an example of a current control circuit 905 that may be used in a variable current source circuit system embedded in a MRAM IC as contemplated by the present invention. Any one or all of the plurality of current control circuits 905A, 905B, 905C, and 905D may include the components of the current control circuit 905 including a register 912, a programmable fuse 914 and a multiplexer 916.

The register 912 has a register output 913, and the programmable fuse 914 has a programmable signal output 917. The multiplexer 916 is connected to receive the register output 913 and the programmable signal output 917. The multiplexer 916 is controlled to select in a well known manner such as by a binary select signal, one of the register output or the programmable signal output as a current source control signal routed through node 906 to at least one of the plurality of variable current source circuits 910A, 910B, for example. Node 906 corresponds to any of nodes 906A, 906B, 906C, and 906D, for example.

The configuration shown in FIG. 8 illustrates one configuration for further improving the flexibility of an MRAM IC for use both as a test vehicle and as a production part default register values set by programmable fuses. Circuitry is provided to multiplex the control signal of each variable current source element between the register value and the preset value provided by the programmable fuse. One strength of this arrangement is that the set of current source levels can be tested to find an optimal set of current values. If the optimal set is different than the preset values of the programmable fuses, then the fuses can be altered to yield the optimal set of currents. This provides an invaluable means to accommodate multiple operating points with a single MRAM circuit since programming can be done post-production.

Figure 9:
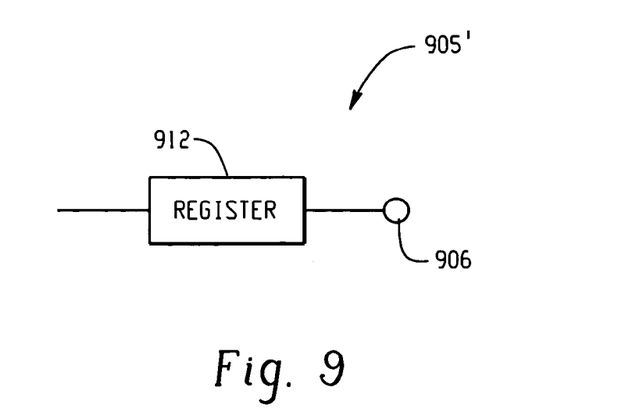
FIG. 9 shows a schematic circuit diagram of an example of an alternative current control circuit that may be for a variable current source circuit system embedded in an MRAM IC integrated circuit as contemplated by the present invention.

Referring now to FIG. 9, there shown schematically is an alternate example of a current control circuit 905' that may be used in a variable current source circuit system embedded in an MRAM IC as contemplated by the present invention. Any one or all of the plurality of current control circuits 905A, 905B, 905C, and 905D may include a register 912. In one example embodiment, the plurality of current control circuits 905A, 905B, 905C, and 905D further comprise a plurality of registers 912 arranged in a scan fashion as shown in FIG. 7. The register 912 preferably outputs a binary variable current control signal generated off chip response to or from a previous current controller, where the binary variable current control signal operates on the variable current source 905A to provide a first binary control signal 906A to variable current source 910A.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A bias tuning circuit for a MRAM comprising, in combination:
    a bias generator having a bias output;
    a plurality of switches, each of the switches having a word reference input and a mirror transistor output;
    a plurality of mirror transistors connected to the mirror transistor outputs;
    a transistor connected to the bias output of the bias generator and further connected in a mirror configuration with the plurality of mirror transistors and having a tuned reference output; and
    a selector to select one of the mirror transistors to activate the transistor to set a voltage to the plurality of mirror transistors.

2. The bias tuning circuit of claim 1 with the each one of the plurality of mirror transistors having a different gain.

3. The bias tuning circuit of claim 1 further comprising, in combination:
    a pad;
    a indicator transistor in a mirror configuration with the transistor and connected to the pad to provide an indicator.

4. The bias tuning circuit of claim 3 with the pad being an external pad.

5. The bias tuning circuit of claim 3 with the indicator transistor having a gain that is a multiple of the transistor.

6. The bias tuning circuit of claim 1 with the plurality of mirror transistors are n-channel transistors.

7. The bias tuning circuit of claim 1 with the plurality of switches being transistors.

8. The bias tuning circuit of claim 1 with the transistor being an N-channel transistor.

9. The bias tuning circuit of claim 1 with the bias generator being a temperature and voltage compensated bias generator.

10. The bias turning circuit of claim 1 with the selector selecting one of the plurality of mirror transistors to compensate for a tested parameter.

11. The bias tuning circuit of claim 10 with the tested parameter being a manufacturing variance.

* * * * *

UNITED STATES PATENT AND TRADEMARK OFFICE
CERTIFICATE OF CORRECTION

PATENT NO. : 7,113,422 B2 Page 1 of 1
APPLICATION NO. : 10/724984
DATED : September 26, 2006
INVENTOR(S) : Theel It is certified that error appears in the above-identified patent and that said Letters Patent is hereby corrected as shown below:

In column 14, line 47, delete "turning" and insert -- tuning --.

Signed and Sealed this

Fifth Day of December, 2006

JON W. DUDAS
*Director of the United States Patent and Trademark Office*